(12) United States Patent
Chang (10) Patent No.: US 8,305,094 B2
(45) Date of Patent: Nov. 6, 2012

(54) RESISTANCE MEASURING DEVICE, DISPLAY PANEL, AND MEASURING METHOD OF BONDING RESISTANCE

(75) Inventor: Hsi-Ming Chang, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 731 days.

(21) Appl. No.: 12/554,918

(22) Filed: Sep. 6, 2009

(65) Prior Publication Data

US 2010/0295567 A1  Nov. 25, 2010

(30) Foreign Application Priority Data

May 19, 2009  (TW) .............................. 98116545 A (51) Int. Cl.
*G01R 27/08* (2006.01)

(52) U.S. Cl. ........ 324/691; 324/537; 324/713; 324/714; 324/715; 324/722

(58) Field of Classification Search .................. 324/765, 324/713–715, 722–724, 537, 750.3, 754.07, 324/754.08, 756.01–756.07, 760.01, 760.02, 324/762.01–763.02, 538
See application file for complete search history.

(56) References Cited

U.S. PATENT DOCUMENTS 6,466,047 B1 * 10/2002 Doherty et al. .......... 324/750.25
6,940,301 B2    9/2005 Chen

\* cited by examiner

*Primary Examiner* — Huy Q Phan
*Assistant Examiner* — Temilade S Rhodes-Vivour
(74) *Attorney, Agent, or Firm* — Winston Hsu; Scott Margo (57) ABSTRACT

The resistance measuring device of the present invention includes switch transistors and switch conductive lines disposed between the bonding pads on a first substrate and between the bumps on a second substrate, such that the bonding pads and the bumps are conducted when the transistors are turned on, and the bonding resistance between at least one of the bonding pads and its corresponding bump can be directly measured.

23 Claims, 5 Drawing Sheets

RESISTANCE MEASURING DEVICE, DISPLAY PANEL, AND MEASURING METHOD OF BONDING RESISTANCE

BACKGROUND OF THE INVENTION

1. Field of the Invention

This invention is related to a resistance measuring device and a measuring method of bonding resistance, and more particularly, to a resistance measuring device and a measuring method of bonding resistance of the surface of a display panel.

2. Description of the Prior Art

Comparing to traditional displays, flat display panels have special advantages such as light weight and small thickness. They gradually became the main stream of the display market and are widely applied to consumer televisions, personal computer displays and portable electronic devices or information products such as cellular phones, digital cameras, and portable music players. Taking a liquid crystal display (LCD) for example, the surface of its display panel includes a plurality of bonding pads bonding to integrated circuit (IC) chips or circuit boards in order to deliver external signals to the display panel to produce images. The bonding media of the bonding pads to the IC chips or other external circuits includes the conductive bonding provided by anisotropic conductive film (ACF). However, in the manufacturing process of flat display panels, it is uneasy to use simple methods or equipment to effectively measure the bonding performance or bonding resistance of ACF. Usually, additional testing bonding pads have to be placed for enabling the measuring. However, the extra testing bonding pads may affect the operation efficiency of the display panel and the bonding resistance of ACF may not be measured directly yet.

SUMMARY OF THE INVENTION

Therefore, the primary objective of the present invention is to provide a resistance measuring device and a measuring method thereof applied to display panels, which only require transistors and conductive lines disposed between the bonding pads of the display panel and the bumps of IC chips to directly measure the bonding resistance between the bonding pads and IC chips easily through simple steps.

According to the claimed invention, a resistance measuring device is provided. The resistance measuring device comprises:

a first substrate comprising a bonding area disposed thereon, the first substrate comprising the following elements disposed on a surface of the first substrate:
  a first bonding pad, a second bonding pad, a third bonding pad, and a fourth bonding pad disposed orderly in the bonding area;
  a first switch transistor disposed in the bonding area, a source and a drain or a drain and a source of the first switch transistor being electrically connected to the second bonding pad and the third bonding pad respectively;
  a switch conductive line electrically connected to a gate of the first switch transistor; and
  a switch connection device electrically connected to the first switch conductive line; and
a second substrate disposed above the bonding area and comprising:
  a first measuring bump, a second measuring bump, a third measuring bump, and a fourth measuring bump disposed orderly on a lower surface of the second substrate and respectively corresponding to and electrically connected to the first bonding pad, the second bonding pad, the third bonding pad, and the fourth bonding pad;
  a second switch transistor, a source and a drain or a drain and a source of the second switch transistor being electrically connected to the first measuring bump and the third measuring bump respectively.
  a third switch transistor, a source and a drain or a drain and a source of the third switch transistor being electrically connected to the third measuring bump and the fourth measuring bump respectively;
  a second switch conductive line electrically connected to a gate of the second switch transistor and a gate of the third switch transistor; and
  a switch bump disposed on the lower surface of the second substrate and electrically connected to the second switch conductive line.

According to the claimed invention, a display panel is further provided. The display panel comprises:

an upper substrate;
a lower substrate disposed parallel to and under the upper first substrate, the lower substrate comprising a periphery circuit region thereon, the periphery circuit region further comprising a bonding area, and the lower substrate comprising the following elements disposed on its upper surface:
  at least a first bonding pad, a second bonding pad, a third bonding pad, and a fourth bonding pad disposed orderly on the surface of the lower substrate;
  a first switch transistor, a source and a drain or a drain and a source of this first switch transistor being electrically connected to the second bonding pad and the third bonding pad respectively;
  a substrate switch conductive line electrically connected to a gate of the first switch transistor;
  a switch connection device disposed in the periphery circuit region out of the bonding area and electrically connected to the substrate switch conductive line;
  a switch bonding pad disposed in the bonding area and electrically connected to the switch connection device; and
  a first test pad, a second test pad, a third test pad, and a fourth test pad disposed in the peripheral circuit out of the bonding area and electrically connected to the first bonding pad, the second bonding pad, the third bonding pad, and the fourth bonding pad respectively;
an IC chip disposed on the surface of the bonding area, the IC chip comprises the following elements on its lower surface:
  a first measuring bump, a second measuring bump, a third measuring bump, and a fourth measuring bump respectively corresponding to and electrically connected to the first bonding pad, the second bonding pad, the third bonding pad, and the fourth bonding pad;
  a second switch transistor, a source and a drain or a drain and a source of the second switch transistor being electrically connected to the first measuring bump and the third measuring bump respectively;
  a third switch transistor, a source and a drain or a drain and a source of the third switch transistor being electrically connected to the third measuring bump and the fourth measuring bump respectively;
  a chip switch conductive line electrically connected to a gate of the second switch transistor and a gate of the third switch transistor; and a switch bump electrically connected to the chip switch conductive line and to the switch bonding pad;

an ACF disposed between the IC chip and the lower substrate for electrically connecting the first, the second, the third, and the fourth bonding pads to the first, the second, the third and the fourth measuring bumps respectively.

According to the claimed invention, a measuring method of bonding resistance is even further provided. The measuring method of bonding resistance comprises the following steps:

(a) providing a resistance measuring device, which comprises:

a first substrate, the surface of which comprising a bonding area and a first bonding pad, a second bonding pad, a third bonding pad, and a fourth bonding pad disposed orderly in the bonding area on the surface of the first substrate;

a first switch test set comprising:

a first switch transistor comprising a source and a drain or a drain and a source electrically connected to the second and the third bonding pads respectively;

a first switch conductive line electrically connected to a gate of the first switch transistor; and a switch connection device electrically connected to the first switch conductive line;

a second substrate disposed above the bonding area, the second substrate comprising a first bump, a second bump, a third bump, and a fourth bump disposed on a lower surface of the second substrate and electrically connected to the first bonding pad, the second bonding pad, the third bonding pad, and the fourth bonding pad respectively; and a second switch test set comprising:

a second switch transistor comprising a source and a drain or a drain and a source electrically connected to the first and the third bumps respectively;

a third switch transistor comprising a source and a drain or a drain and a source electrically connected to the third and the fourth bumps respectively;

a second switch conductive line electrically connected to a gate of the second switch transistor and a gate of the third switch transistor; and a switch bump electrically connected to the second switch conducting line;

(b) using the switch connection device and the switch bump to turn on the first switch test set and the second switch test set to make the first, the second, and the third switch transistors conductive;

(c) applying a current i to the first bonding pad and the second bonding pad and providing a voltmeter for measuring the voltage differences between the third and the fourth bonding pads to obtain a voltage value v; and (d) defining a bonding resistance between the third bonding pad and the third bump as a resistance value r and calculating the formula r=v/i to figure out the resistance value r.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
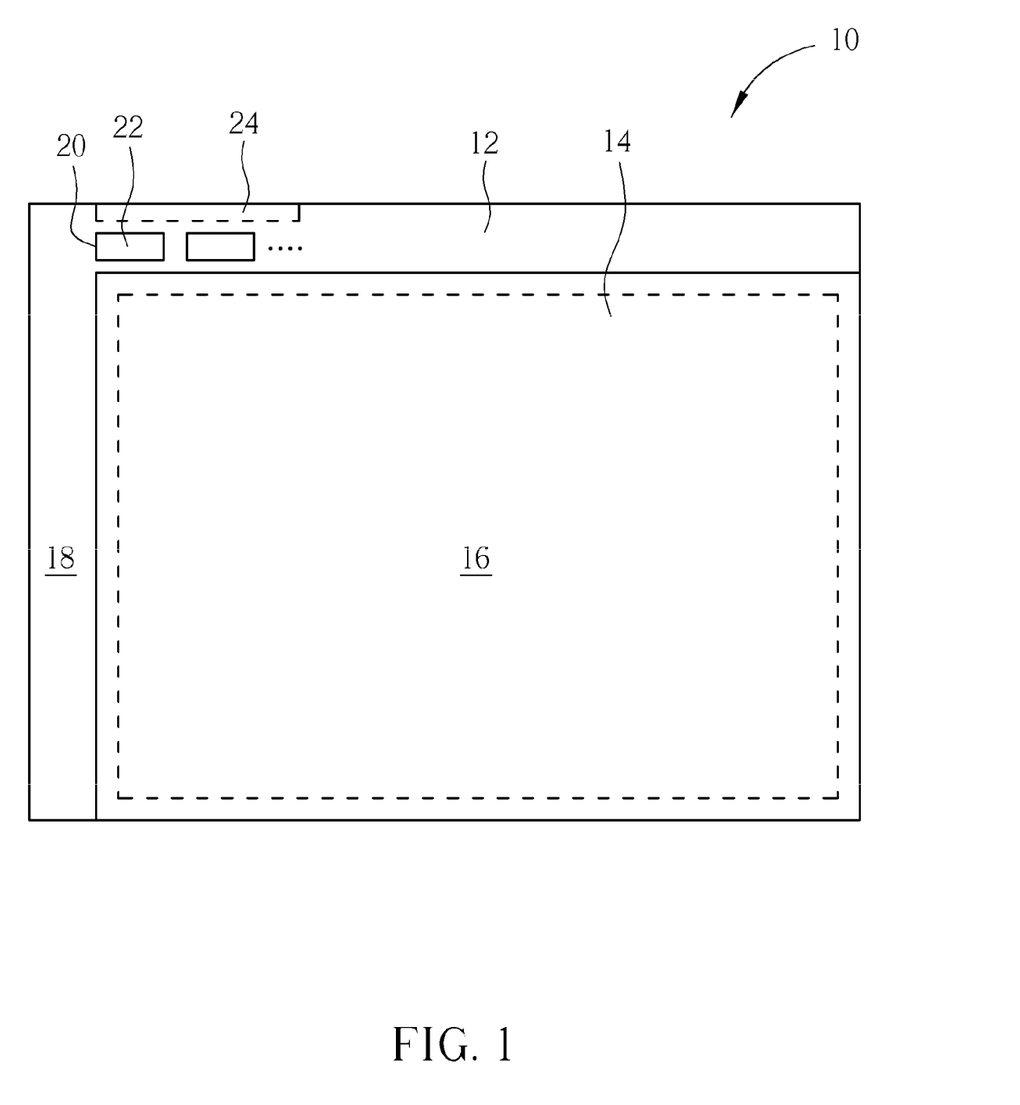
FIG. 1 is a schematic diagram of the top view of this flat display panel of the present invention.

Referring to FIG. 1, FIG. 1 is a schematic diagram of the top view of a flat display panel of the present invention. The flat display panel 10 of the present invention is a chip-on-glass (COG) display panel, and may be, but not limited to, an LCD panel, a plasma display panel, or an electroluminescent display panel. The flat display panel 10 comprises a lower substrate 12 and an upper substrate 14 that covers a portion of the lower substrate 12. The overlapping area of the lower and upper substrates 12 and 14 is defined as the display region 16 of the flat display panel 10. The portion of the lower substrate 12 which is not covered by the upper substrate 14 is defined as a periphery circuit region 18. The periphery circuit region 18 comprises at least a chip bonding area 20 and a flexible printed circuit (FPC) bonding area 24. An IC chip 22 is disposed in the chip bonding area 20, and at least a FPC (not shown) may be disposed in the FPC bonding area 24 for delivering external signals to the IC chip 22 and the display region 16. It should be noted that the lower substrate 12 and the IC chip 22 indicate the first substrate and the second substrate mentioned previously.

Figure 2:
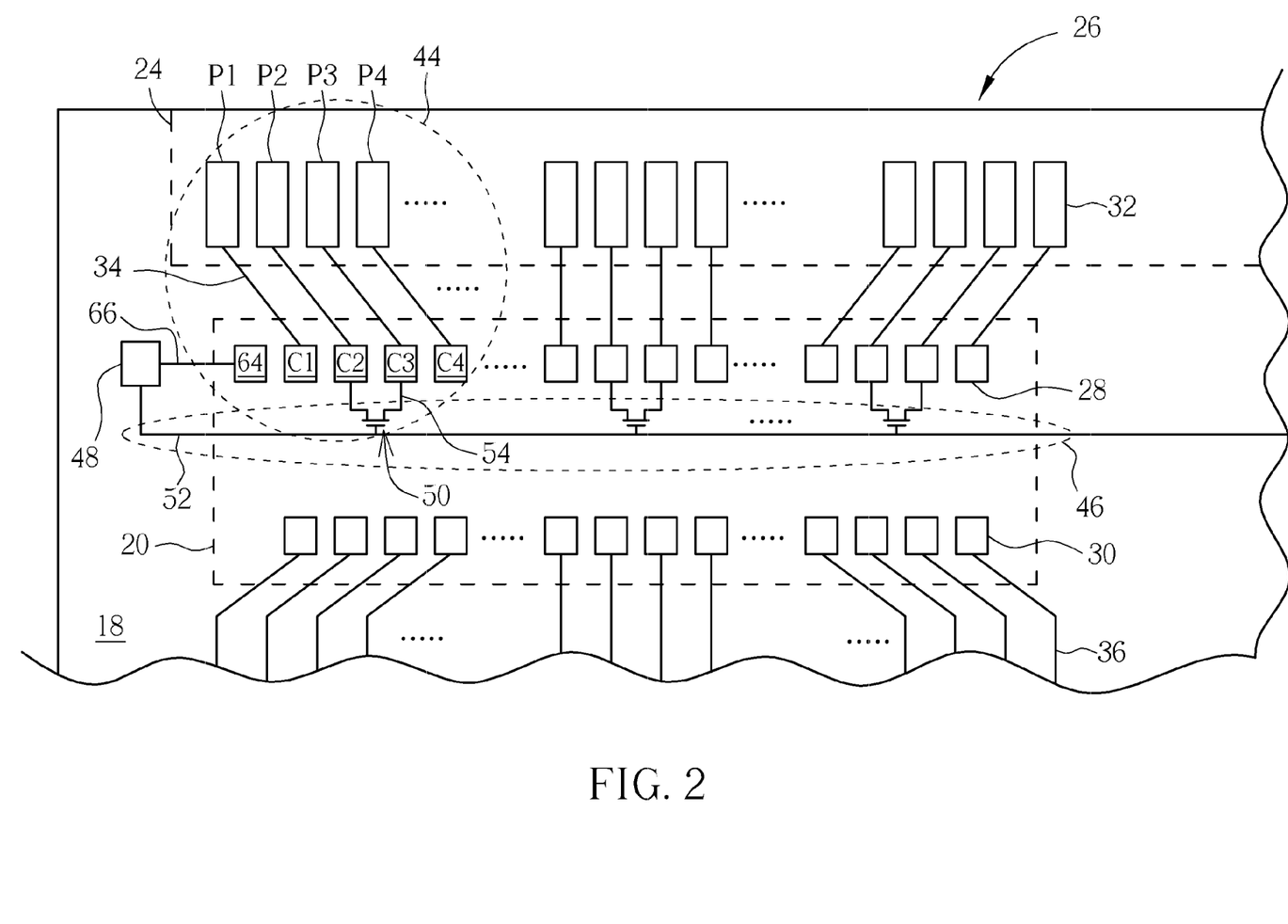
FIG. 2 is an enlarged schematic diagram of the partial periphery circuit region of the flat display panel of the present invention.
Figure 3:
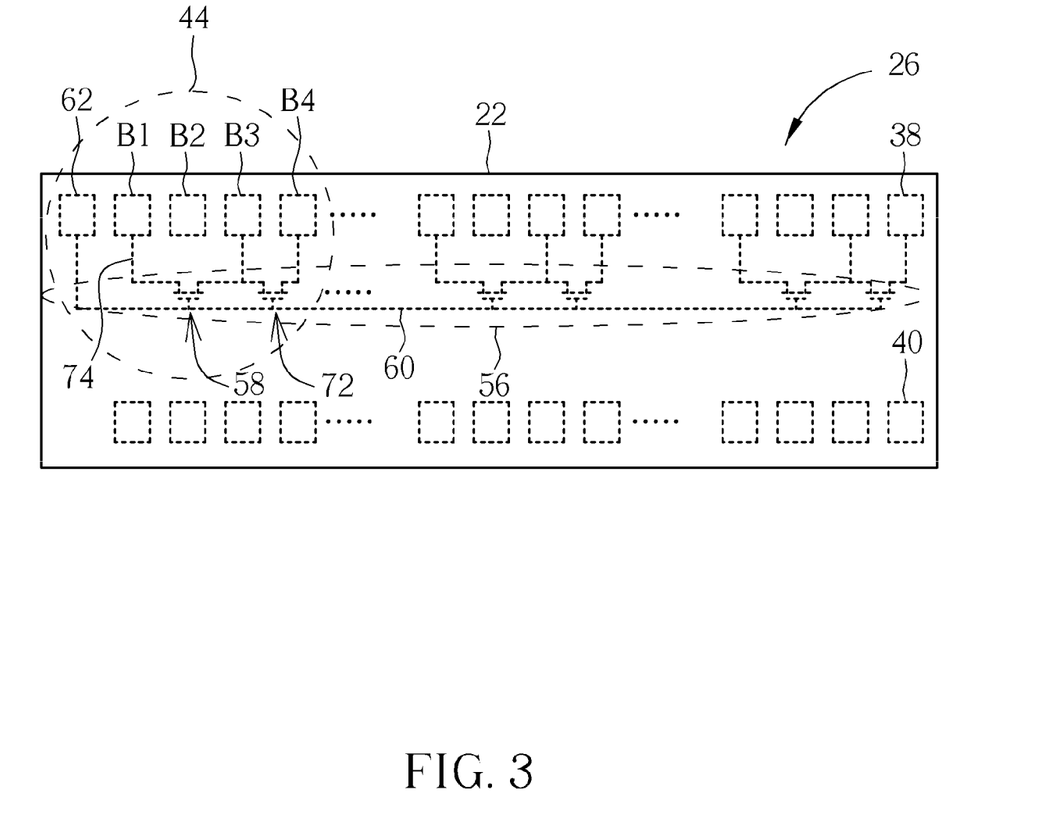
FIG. 3 is an enlarged schematic diagram of the top view of the partial IC chip of the flat display panel of the present invention.

Please refer to FIG. 2 and FIG. 3, which illustrate the enlarged schematic diagrams of the partial periphery circuit region 18 indicated in FIG. 1. FIG. 2 shows the structure of the chip bonding area 20 where the IC chip 22 is not placed yet. FIG. 3 illustrates the top view of the structure of the IC chip 22. The chip bonding area 20 comprises a plurality of COG bonding pads 28 which are arranged in a straight line and a plurality of COG bonding pads 30 also arranged in a straight line on the surface of the lower substrate 12. These COG bonding pads 28 and 30 are used to be electrically connected to the bumps 38 and 40 on the lower surface of the IC chip 22. Please note that only twelve COG bonding pads 28 were illustrated in FIG. 2 for demonstration. The FPC bonding area 24 disposed on the upper side of the chip bonding area 20 comprises a plurality of FPC bonding pads 32 which respectively correspond to a COG bonding pad 28 and are electrically connected to the corresponding COG bonding pads 28 by the conductive lines 36 respectively. The conductive lines 36 may comprise scan lines or data lines and may be disposed in and extend to the display region 16.

Figure 4:
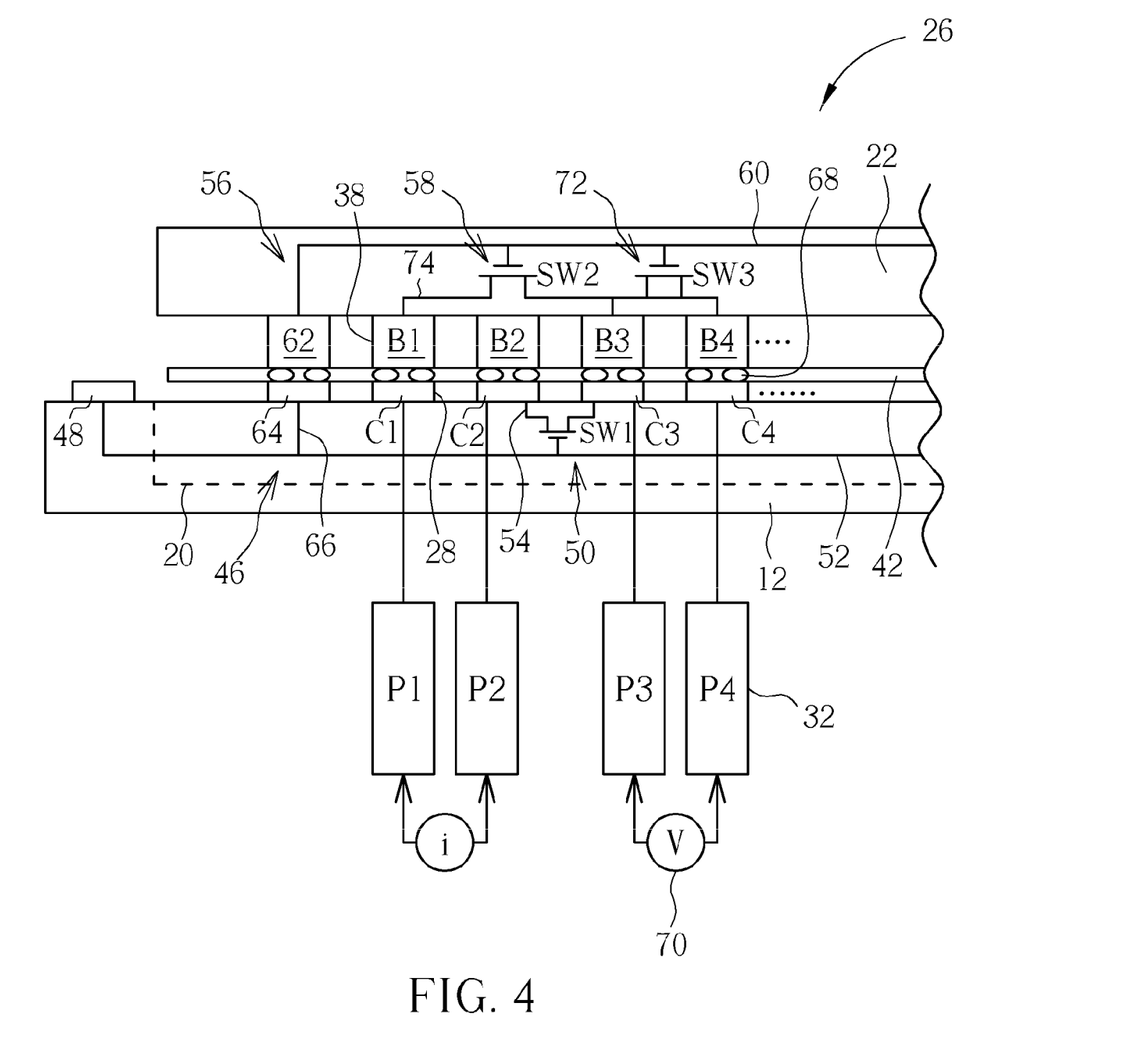
FIG. 4 is a side-view schematic diagram of the structure of the resistance measuring device of the present invention.

A plurality of bumps 38 and a plurality of bumps 40 are disposed on the lower surface of the IC chip 22 and respectively correspond to the COG bonding pads 28 and 30. Therefore, when the IC chip 22 is disposed on the surface of the chip bonding area 20 as illustrated in FIG. 1, the bumps 38 and 40 will be electrically connected to the corresponding COG bonding pads 28 and 30 respectively through conductive materials. In preferable embodiments, the flat display panel 10 of the present invention further comprises at least one ACF 42, as illustrated in FIG. 4, disposed between the COG bonding pads 28 and 30 and the IC chip 22 to electrically connect the IC chip 22 and the COG bonding pads 28 and 30.

In order to measure the bonding resistance between the bumps 38 and the COG bonding pads 28, the flat display panel 10 of the present invention especially comprises a resistance measuring device 26 comprising at least the COG bonding pads 28 disposed on the surface of the lower substrate 12 and the bumps 38 disposed on the lower surface of the IC chip 22. Every four COG bonding pads 28 and four bumps 38 are defined as a resistance measuring unit 44 of the resistance measuring device 26 of the present invention. For example, the COG bonding pads 28 in the far left side are defined as the first bonding pad C1, the second bonding pad C2, the third bonding pad C3, and the fourth bonding pad C4. The FPC bonding pads 32 and the bumps 38 corresponding to the first bonding pad C1, the second bonding pad C2, the third bonding pad C3, and the fourth bonding pad C4 are defined as the first test pad P1, the second test pad P2, the third test pad P3, and the fourth test pad P4, and the first measuring bump B1, the second measuring bump B2, the third measuring bump B3, and the fourth measuring bump B4. In addition, every resistance measuring unit 44 comprises a first switch transistor 50 and a first switch conductive line 52. Because the first switch conductive line 52 is disposed on the surface of the lower substrate 12, it may be also called as "substrate switch conductive line". The first switch conductive line 52 is electrically connected to the gate of the first switch transistor 50. The source and drain or the drain and the source of the first switch transistor 52 are electrically connected to the second bonding pad C2 and the third bonding pad C3 respectively through the first conductive lines 54. It means that the second bonding pad C2 and the third bonding pad C3 are serial connected by the first switch transistor 50. When the first switch transistor is turned on, the second bonding pad C2 and the third bonding pad C3 are electrically connected to each other. It should be noted that the first switch transistor 50 in the periphery circuit region 18 is preferably a thin film transistor (TFT) that may be manufactured together with the TFT in each pixel in the display region 16. The first conductive lines 54 and the first switch conductive line 52 may be composed of the same or different conductive thin-film layers on the surface of the lower substrate 12. For example, the material of the first conductive lines 54 and the first switch conductive line 52 may be the same as the conductive lines 34 or the conductive lines 36 and may be made from the same thin-film deposition process and photolithography-etching process. As a result, the first switch transistor 50, the first switch conductive line 52, and the first conductive lines 54 may be manufactured simultaneously with the electronic devices of the display region 16, which may only require simple modifications of the photolithography patterns of the photomasks of the thin film deposition without additional manufacturing processes.

On the other hand, the IC chip 22 further comprises a second switch transistor 58, a third switch transistor 72, and a second switch conductive line 60 disposed in each resistance measuring unit 44. Since the second switch conductive line 60 is disposed in the IC chip 22, it may be called as "chip switch conductive line". The source and the drain or the drain and the source of the second switch transistor 58 are electrically connected to the first measuring bump B1 and the third measuring bump B3 respectively. The source and the drain or the drain and the source of the third switch transistor 72 are electrically connected to the third measuring bump B3 and the fourth measuring bump B4 respectively. It means the first measuring bump B1, the third measuring bump B3, and the fourth measuring bump B4 are serial connected through the second switch transistor 58 and the third switch transistor 72. When the second switch transistor 58 and the third switch transistor 72 are turned on, the first measuring bump B1, the third measuring bump B3, and the fourth measuring bump B4 are in serial connection. In addition, the IC chip 22 comprises a plurality of second conductive lines 74 for electrically connecting the second and the third switch transistors 58 and 72 and the first, the third, and the fourth measuring bumps B1, B3, and B4.

In preferable embodiments of the present invention, the resistance measuring device 26 also comprises a switch connection device 48, a switch bonding pad 64, and a switch bump 62. The switch connection device 64 is disposed in the periphery circuit region 18 out of the chip bonding area 20. The switch bonding pad 64 is disposed in the chip bonding area 20, such as at one side of the first bonding pad C1. The switch bump 62 is disposed on the lower surface of the IC chip 22, corresponding to the switch bonding pad 64. In addition, the switch connection device 48 and the switch bump 62 are electrically connected to the first switch conductive line 52 and the second switch conductive line 60 respectively. The switch connection device 48 is electrically connected to the switch bonding pad 64 disposed in the chip bonding area 20 through the conductive line 66. In preferable embodiments of the present invention, the switch connection device 48 may be a bonding pad. When the IC chip 22 is disposed above the surface of the chip bonding area 20, the switch bump 62 will be electrically connected to the switch bonding pad 64. It should be noted that the first switch conductive line 52, the switch connection device 48, the first switch transistor 50, and the first conductive lines 54 in the periphery circuit region 18 may be defined as the first switch test set since they are the special devices of the resistance measuring device 26 of this present invention. For example, this first switch test set may be called as the bonding-area switch test set 46. Similarly, the second and the third switch transistors 58 and 72, the second switch conductive line 60, and the switch bump 62 disposed in the IC chip 22 are part of the resistance measuring device 26 of the present invention and may be defined as a second switch test set. For example, they may be called as the chip switch test set 56.

Please refer to FIG. 4. FIG. 4 is a schematic diagram of the side view of the IC chip 22 indicated in FIG. 3 disposed on the chip bonding area 20 indicated in FIG. 2. The schematic status of the electrical connection of the resistance measuring device 26 of the present invention when performing a measuring process the resistance is also illustrated in FIG. 4. The flat display panel 10 of the present invention comprises an ACF 42 for electrically connecting the IC chip 22 and the conductive devices of the chip bonding area 20. When the IC chip 22 and the chip bonding area 20 are being connected, the ACF 42 will be disposed between the IC chip 22 and the chip bonding area 20. The bumps 38 and 40 will be relative to their corresponding COG bonding pads 28 and 30 vertically. Then the bonding process of the ACF 42 will be proceeded to make the conducting particles 68 of the ACF 42 stressed so as to electrically connecting the bumps 38 and 40 in its upper side to the COG bonding pads 28 and 30 in its lower side perpendicularly or vertically. In this situation, the resistance measuring device 26 of the present invention may measure the bonding resistance of the bumps 38 and the COG bonding pads 28.

Figure 5:
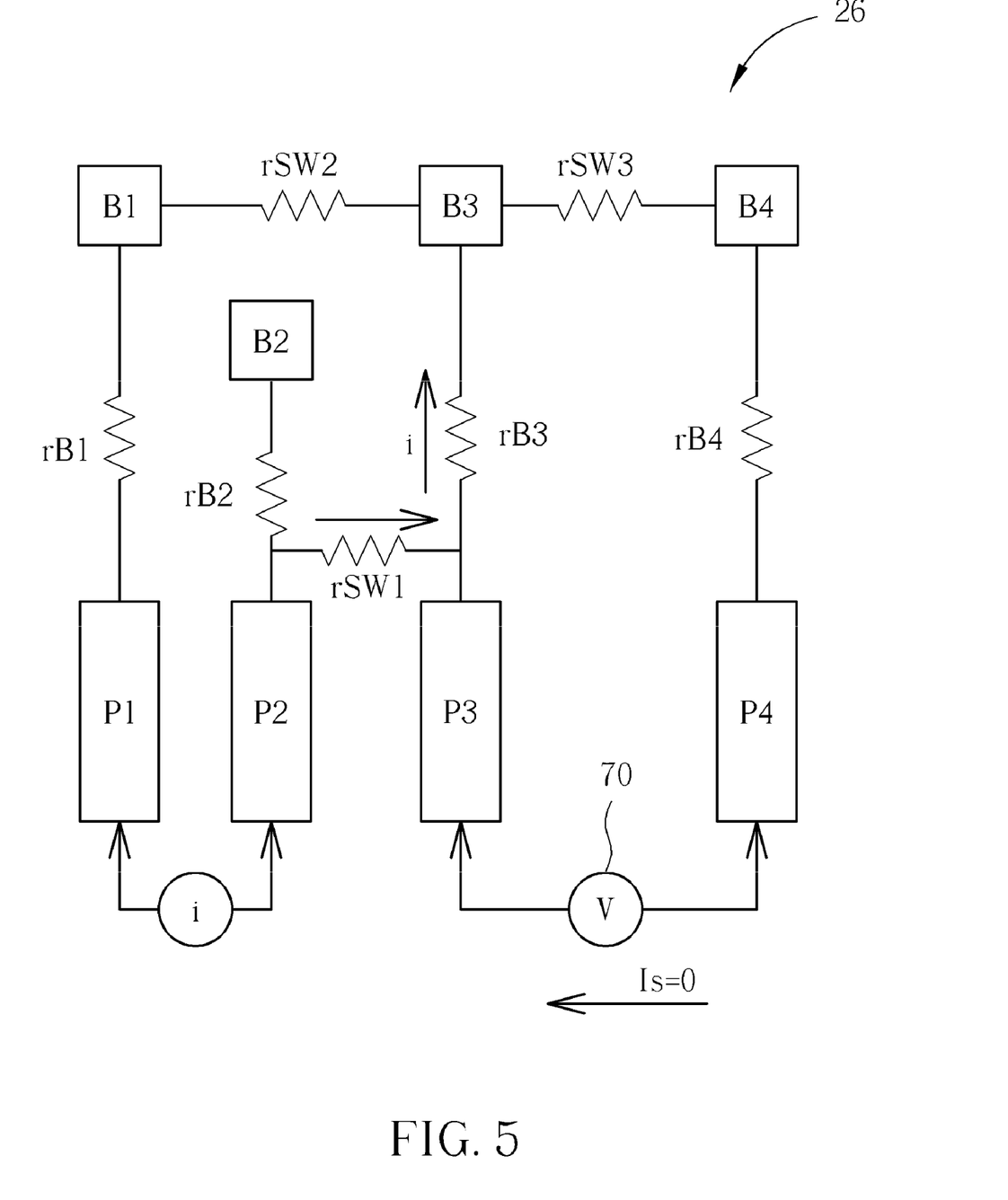
FIG. 5 is an equivalent circuit diagram of the resistance measuring device when a measuring process of resistance is performed.

As shown in FIG. 4, the switch connection device 48 is capable of simultaneously control the bonding-area switch test set 46 on the surface of the lower substrate 12 and the chip switch test set 56 on the IC chip 22 to be turned on or turned off. To simplify the explanation, the first switch transistor 50 is represented by the transistor SW1, the second switch transistor 58 electrically connected to the first and the third measuring bumps B1 and B3 is represented by the transistor SW2, and the third switch transistor 72 electrically connected to the measuring bumps B3 and B4 is represented by the transistor SW3. Please refer to FIG. 5. FIG. 5 is an equivalent circuit diagram of the resistance measuring device 26 when the first, the second and the third switch transistors 50, 58, and 72 are turned on. As shown in FIG. 5, a resistance rB1 exists between the first measuring bump B1 and the first bonding pad C1 or the first test pad P1. A resistance rB2 exists between the second measuring bump B2 and the second bonding pad C2 or the second test pad P2. A resistance rB3 exists between the third measuring bump B3 and the third bonding pad C3 or the third test pad P3. A resistance rB4 exists between the fourth measuring bump B4 and the fourth bonding pad C4 or the fourth test pad P4. When performing the measuring process of the bonding resistance, a voltage is provided through the switch connection device 48 to turn on the first switch transistor 50, the second switch transistor 58, and the third switch transistor 72. It means that the transistors SW1, SW2, and SW3 form a conductive route and are conducted and respectively have resistance rSW1, rSW2, and rSW3. Furthermore, a current i is simultaneously applied to the first test pad P1 and the second test pad P2, and a voltmeter 70 is used to measure the voltage v between the third test pad P3 and the fourth test pad P4. Because the voltmeter 70 has high resistance, the sensed current Is passing through the voltmeter 70 is 0. The current passing through the resistance rB3 is i, and the current passing through the resistance rSW3 and the resistance rB4 is 0. Therefore, there is no voltage difference between the third measuring bump B3, the fourth measuring bump B4, and the fourth test pad P4, and the voltage v measured between the third test pad P3 and the fourth test pad P4 is the voltage difference of the resistance rB3. Since rB3=v/i, the bonding resistance may be calculated between the third test pad P3 or the third bonding pad C3 and its corresponding third measuring bump B3, which means the bonding resistance of the third measuring bump B3 and the third bonding pad C3 can be figured out.

On the other hand, after measuring, the chip switch test set 56 and the bonding-area switch test set 46 may be turned off through the switch connection device 48 to disconnect each COG bonding pad 28 and each bump 38 such that the circuit status of the flat display panel 10 is recovered to the normal operation and signal delivering of the flat display panel 10 will not be effected.

According to the principle of the present invention, the resistance measuring device 26 is disposed in the periphery circuit region 18 and on the IC chip 22 for measuring the bonding resistance between the bumps 38 and the COG bonding pads 28, which means it measures the boding resistance of the ACF 42 between the bumps 38 and the COG bonding pads 28. The resistance measuring device 26 of the present invention comprises the bonding-area switch test set 46 disposed in the periphery circuit region 18 and the chip switch test set 56 disposed in the IC chip 22. The bonding-area switch test set 46 comprises the first switch conductive line 52, the first switch transistor 50, and the switch connection device 48. The bonding-area switch test set 46 preferably further comprises the switch bonding pad 64, and even preferably comprises the first conductive lines 54. The chip switch test set 56 comprises the second switch conductive line 60, the second switch transistor 58, and the third switch transistor 72. Furthermore, the chip switch test set 56 preferably comprises the switch bump 62 and even preferably comprises the second conductive lines 74. Therefore, by disposing the specific conductive lines and switch transistors mentioned above between the COG bonding pads 28 and the bumps 38, the electrical conductivity between the COG bonding pads 28 and the bumps 38 can be controlled. Furthermore, with the FPC bonding pads 32 currently existing in general display panels as the test pads for probe tests, the resistance measuring device 26 of the present invention is complete. As a result, the actual bonding resistance between the COG bonding pads 28 and the corresponding bumps 38 can be directly measured through the FPC bonding pads 32 when the first, the second, and the third switch transistors 50, 58, and 72 are turned on by utilizing the resistance measuring device 26.

According to the embodiment mentioned previously, please note that the connection—are switch test set 46 and the chip switch test set of the resistance measuring device 26 of the present invention are simultaneously turned on by the way of applying voltage to the switch connection device 48. However, in various embodiments, the switch bump 62 or the second switch conductive line 60 on the IC chip 22 may be electrically connected to other switch connection devices alternatively provided that said switch connection devices can be used to turn on the chip switch test set 56 when carrying out the resistance measuring process. Therefore, the switch bump 62 and the switch bonding pad 64 are optional and not necessary devices of the resistance measuring device 26 of the present invention. Also, the switch bump 62 may be used as a switch connection device. In addition, the switch connection device 48 is not limited to the formation or structure as a bonding pad as mentioned above.

Furthermore, generally the chip bonding area 26 may comprise more than four COG bonding pads 28, and the IC chip 22 may usually comprise a corresponding quantity of bumps 38 on its lower surface. As a result, when disposing the resistance measuring device 26 of the present invention, it is only necessary to define every four of the COG bonding pads 28 and every four of the bumps 38 as a resistance measuring unit 44, as indicated by the dotted line of FIGS. 2 and 3, by serially connecting the second and the third COG bonding pads 28, such as the second bonding pad C2 and the third bonding pad C3, with a switch transistor that is electrically connected to the first switch conductive line 52 or the switch connection device 48 and by serially connecting the first, third, and fourth bumps 38, such as the first, third, and fourth measuring bumps B1, B3, and B4, with two switch transistors that are simultaneously electrically connected to the second switch conductive line 60 or the switch connection device 48. Accordingly, the placement of a complete resistance measuring device 26 of the present invention is finished. Therefore, a chip bonding area 20 and its corresponding IC chip 22 may comprise a plurality of resistance measuring units 44. When performing the resistance measuring process, a plurality of resistance measuring units 44 may be simultaneously turned on through the switch connection device 48. The tester may choose according to his/her need to measure the boding resistance between different bumps 38 and COG bonding pads 28 orderly, simultaneously, or optionally.

Comparing to the prior art, the resistance measuring device of the present invention only require to place specific conductive lines and transistors in the periphery circuit region and the chip of the display panel to connect the currently existing bonding pads, bumps, and allocation of the conductive lines for proceeding the resistance measuring between the bumps and the bonding pads. According to the measuring method of bonding resistance and the resistance measuring device of the present invention, the bonding performance of the ACF can be measured directly, which means the actual bonding resistance between the bumps and the bonding pads can be obtained directly. In addition, after the measuring process, it is required to only turn off the bonding-area switch test set and the chip switch test set to disconnect every bump and bonding pad and to recover the normal circuit status of the display panel. Therefore, signal delivering will not be effected in the operation of the display panel. As a result, according to the present invention, it is not necessary to carry out complicated measuring process or to place specific test pads through extra manufacturing processes, and the bonding resistance between the conductive materials can be measured with simple and effective method.

Those skilled in the art will readily observe that numerous modifications and alterations of the device and method may be made while retaining the teachings of the invention.

What is claimed is:

1. A resistance measuring device comprising:
   a first substrate having a bonding area defined thereon, the first substrate comprising the following elements on a surface on the first substrate:
      a first bonding pad, a second bonding pad, a third bonding pad, and a fourth bonding pad disposed orderly in the bonding area;
      a first switch transistor disposed in the bonding area, a source and a drain or a drain and a source of the first switch transistor being electrically connected to the second bonding pad and the third bonding pad respectively;
      a first switch conductive line electrically connected to a gate of the first switch transistor; and
      a switch connection device electrically connected to the first switch conductive line; and
   a second substrate disposed above the bonding area and comprising:
      a first measuring bump, a second measuring bump, a third measuring bump, and a fourth measuring bump disposed orderly on a lower surface of the second substrate and respectively corresponding to and electrically connected to the first bonding pad, the second bonding pad, the third bonding pad, the third bonding pad, and the fourth bonding pad;
      a second switch transistor, a source and a drain or a drain and a source of the second switch transistor being electrically connected to the first measuring bump and the third measuring bump respectively;
      a third switch transistor, a source and a drain or a drain and a source of the third switch transistor being electrically connected to the third measuring bump and the fourth measuring bump respectively;
      a second switch conductive line electrically connected to a gate of the second switch transistor and a gate of the third switch transistor; and
      a switch bump disposed on the lower surface of the second substrate and electrically connected to the second switch conductive line.

2. The resistance measuring device of claim 1, wherein the first substrate comprises a substrate and the second substrate comprises an integrated circuit (IC) chip.

3. The resistance measuring device of claim 2, further comprising a switch bonding pad disposed in the bonding area, the switch bonding pad being electrically connected to the switch bump and the switch connection device.

4. The resistance measuring device of claim 2, wherein the resistance measuring device is applied to a display panel which comprises an upper substrate disposed above the first substrate.

5. The resistance measuring device of claim 4, wherein the display panel is a chip-on-glass (COG) display panel, and the first bonding pad, the second bonding pad, the third bonding pad, and the fourth bonding pad are COG bonding pads.

6. The resistance measuring device of claim 5, wherein the bonding area comprises a plurality of COG bonding pads, a plurality of bumps are disposed on the lower surface of the IC chip, and the first, the second, the third, and the fourth bonding pads and the first, the second, the third, and the fourth measuring bumps are defined as a resistance measuring unit.

7. The resistance measuring device of claim 1, further comprising an anisotropic conductive film (ACF) disposed between the first and the second substrates, the ACF being used for electrically connecting the first, the second, the third, and the fourth bonding pads to the first, the second, the third, and the fourth measuring bump respectively.

8. The resistance measuring device of claim 1, wherein the switch connection device, the first switch conductive line, and the first switch transistor are defined as a first switch test set.

9. The resistance measuring device of claim 8, wherein the first switch test set further comprises two first conductive lines used for electrically connecting the source or the drain of the first switch transistor to the second bonding pad and electrically connecting another drain or source of the first switch transistor to the third bonding pad respectively.

10. The resistance measuring device of claim 1, wherein the switch bump, the second switch conductive line, the second switch transistor, and the third switch transistor are defined as a second switch test set.

11. The resistance measuring device of claim 10, wherein the second switch test set further comprises a plurality of second conductive lines for electrically connecting the source/drain of the second switch transistor to the first measuring bump, electrically connecting another drain/source of the second switch transistor to the third measuring bump, electrically connecting the source/drain of the third switch transistor to the third measuring bump, and electrically connecting another drain/source of the third switch transistor to the fourth measuring bump respectively.

12. The resistance measuring device of claim 1, wherein the first substrate further comprises a first test pad, a second test pad, a third test pad, and a fourth test pad disposed on the surface of the first substrate and electrically connected to the first bonding pad, the second bonding pad, the third bonding pad, and the fourth bonding pad respectively.

13. The resistance measuring device of claim 12, wherein the first test pad, the second test pad, the third test pad, and the fourth test pad are flexible printed circuit bonding (FPC) bonding pads.

14. The resistance measuring device of claim 1, wherein the first switch transistor is a thin film transistor (TFT), and the first switch conductive line is formed with a conductive thin-film layer.

15. A display panel, comprising:
   an upper substrate;
   a lower substrate parallel to and under the upper substrate, the lower substrate comprising a periphery circuit region disposed thereon and the periphery circuit region further comprising a bonding area, the lower substrate comprising the following elements disposed on an upper surface of the lower substrate:
      at least a first bonding pad, a second bonding pad, a third bonding pad, and a fourth bonding pad orderly disposed on the upper surface of the lower substrate;
      a first switch transistor, a source and a drain or a drain and a source of the first switch transistor being electrically connected to the second bonding pad and the third bonding pad respectively;
      a substrate switch conductive line electrically connected to a gate of the first switch transistor;

a switch connection device disposed in the periphery circuit region out of the bonding area, the switch connection device being electrically connected to the substrate switch conductive line;

a switch bonding pad disposed in the bonding area and electrically connected to the switch connection device; and a first test pad, a second test pad, a third test pad, and a fourth test pad disposed in the periphery circuit region out of the bonding area and electrically connected to the first bonding pad, the second bonding pad, the third bonding pad, and the fourth bonding pad respectively;

an IC chip disposed on a surface of the bonding area, the IC chip comprising the following elements on a lower surface of the IC chip:

a first measuring bump, a second measuring bump, a third measuring bump, and a fourth measuring bump respectively corresponding to and electrically connected to the first bonding pad, the second bonding pad, the third bonding pad, and the fourth bonding pad;

a second switch transistor, a source and a drain or a drain or a source of the second switch transistor being electrically connected to the first measuring bump and the third measuring bump respectively;

a third switch transistor, a source and a drain or a drain or a source of the third switch transistor being electrically connected to the third measuring bump and the fourth measuring bump respectively;

a chip switch conductive line electrically connected to a gate of the second switch transistor and a gate of the third switch transistor; and a switch bump electrically connected to the chip switch conductive line and the switch bonding pad; and an ACF disposed between the IC chip and the lower substrate for electrically connecting the first, the second, the third, and the fourth bonding pads to the first, the second, the third, and the fourth measuring bumps respectively.

16. The display panel of claim 15, further comprising two first conductive lines for electrically connecting the source or the drain of the first switch transistor to the second bonding pad and electrically connecting drain or the source of the first switch transistor to the third bonding pad respectively.

17. The display panel of claim 15, further comprising a plurality of second conductive lines for electrically connecting the source/drain of the second switch transistor to the first measuring bump, electrically connecting another drain/source of the second switch transistor and the third measuring bump, electrically connecting the source/drain of the third switch transistor to the third measuring bump, and electrically connecting another drain/source of the third switch transistor to the fourth measuring bump respectively.

18. The display panel of claim 15, wherein the display panel is a COG display panel, the first bonding pad, the second bonding pad, the third bonding pad, and the fourth bonding pad are COG bonding pads, and the first test pad, the second test pad, the third test pad, and the fourth test pad are FPC bonding pads.

19. The display panel of claim 15, wherein the first switch transistor is a TFT, and the substrate switch conductive line is formed with a conductive thin-film layer.

20. A measuring method of bonding resistance, comprising the following steps:

(a) providing a resistance measuring device, comprising:

a first substrate comprising a bonding area thereon, a first bonding pad, a second bonding pad, a third bonding pad, and a fourth bonding pad being disposed in the bonding area on a surface of the first substrate;

a first switch test set comprising:

a first switch transistor comprising a source and a drain or a drain and a source electrically connected to the second bonding pad and the third bonding pad respectively;

a first switch conductive line electrically connected to a gate of the first switch transistor; and a switch connection device electrically connected to the first switch conductive line;

a second substrate disposed above the bonding area, a first bump, a second bump, a third bump, and a fourth bump being disposed on a lower surface of the second substrate and respectively corresponding to and electrically connected to the first bonding pad, the second bonding pad, the third bonding pad, and the fourth bonding pad; and a second switch test set comprising:

a second switch transistor comprising a source and a drain or a drain and a source electrically connected to the first bump and the third bump respectively;

a third switch transistor comprising a source and a drain or a drain and a source electrically connected to the third bump and the fourth bump respectively;

a second switch conductive line electrically connected to a gate of the second switch transistor and a gate of the third switch transistor; and a switch bump electrically connected to the second switch conductive line;

(b) using the switch connection device and the switch bump to turn on the first switch test set and the second switch test set to make the first, the second, and the third switch transistors conductive;

(c) applying a current i to the first bonding pad and the second bonding pad, and providing a voltmeter for measuring the voltage difference between the third bonding pad and the fourth bonding pad to obtain a voltage value v; and (d) defining the bonding resistance between the third bonding pad and the fourth bump as a resistance value r, and calculating the formula r=v/i to figure out the resistance value r.

21. The measuring method of claim 20, wherein the first substrate further comprises a switch bonding pad disposed thereon, the switch bonding pad electrically connected to the switch connection device and the switch bump, and the step (b) comprises providing a voltage to the switch connection device to turn on the first switch test set and the second switch test set.

22. The measuring method of claim 20, wherein the resistance measuring device further comprises a first test pad, a second test pad, a third test pad, and a fourth test pad electrically connected to the first bonding pad, the second bonding pad, the third bonding pad, and the fourth bonding pad respectively, and in the step (c), the current i is applied through the first test pad and the second test pad and the voltage value v is measured through the third test pad and the fourth test pad.

23. The measuring method of claim 20, wherein the first switch test set is disposed on the surface of the first substrate, the first switch transistor is a TFT, and the first switch conductive line is formed with a conductive thin-film layer.

* * * * *